US012640407B2

(12) United States Patent (10) Patent No.: US 12,640,407 B2

Rinaldo et al. (45) **Date of Patent: *May 26, 2026**

(54) BATTERY MODEL AND CONTROL APPLICATION CALIBRATION SYSTEMS AND METHODS

(71) Applicant: CPS Technology Holdings LLC, New York, NY (US)

(72) Inventors: Steven G. Rinaldo, Milwaukee, WI (US); Zhihong Jin, Pewaukee, WI (US); Perry M. Wyatt, Wilton, CT (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/793,408

(22) Filed: Aug. 2, 2024

(65) Prior Publication Data

US 2024/0396098 A1 Nov. 28, 2024

Related U.S. Application Data

(63) Continuation of application No. 18/079,125, filed on Dec. 12, 2022, now Pat. No. 12,057,557, which is a
(Continued)

(51) Int. Cl.
*H01M 10/42* (2006.01)
*B60L 3/12* (2006.01)
(Continued)

(52) U.S. Cl.
CPC ............ *H01M 10/425* (2013.01); *B60L 3/12* (2013.01); *B60L 58/12* (2019.02); *G01R 31/367* (2019.01);
(Continued)

(58) Field of Classification Search
CPC .... G01R 19/00; G01R 19/0092; G01R 19/02; G01R 19/04; G01R 19/06; G01R 19/08;
(Continued)

(56) References Cited

U.S. PATENT DOCUMENTS 6,515,452 B2 2/2003 Choo
7,498,772 B2 3/2009 Palladino
(Continued)

FOREIGN PATENT DOCUMENTS

CN 1835273 A 9/2006
CN 104904092 A 7/2014
(Continued)

OTHER PUBLICATIONS

Pawel Malysz, et. al., "State-of-Charge and State-of-Health Estimation with State Constraints and Current Sensor Bias Correction for Electrified Powertrain Vehicle Batteries", IET Electrical Systems in Transportation, vol. 6, No. 2, Jun. 1, 2016, pp. 136-144.
(Continued)

*Primary Examiner* — Anthony R Jimenez
(74) *Attorney, Agent, or Firm* — Boardman & Clark LLP

(57) ABSTRACT

One embodiment of the present disclosure describes systems and methods responsible for reducing errors in a battery model used in the operation of a battery control system. The battery control system may operate based on a predicted response of the battery derived from the battery model. If the battery model is not calibrated/validated, errors in the battery model may propagate through the predicted response of the battery to the operation of the battery control system. A calibration stimulus may result in a difference between an actual response of the battery and the predicted response of the battery to the same calibration stimulus. A validation technique, which uses a difference between the predicted response and the actual response of the battery to the
(Continued)

calibration stimulus as a method to calibrate the battery model, may protect the battery control system from the contribution of errors from an uncalibrated battery model.

20 Claims, 5 Drawing Sheets

Related U.S. Application Data continuation of application No. 16/338,966, filed as application No. PCT/US2017/056367 on Oct. 12, 2017, now Pat. No. 11,527,780.

(60) Provisional application No. 62/407,487, filed on Oct. 12, 2016.

(51) Int. Cl.
| | |
|---|---|
| *B60L 58/12* | (2019.01) |
| *G01R 31/367* | (2019.01) |
| *H01M 10/48* | (2006.01) |

(52) U.S. Cl.
CPC ....... *H01M 10/48* (2013.01); *B60L 2240/545* (2013.01); *B60L 2240/549* (2013.01); *H01M 2010/4271* (2013.01); *H01M 2220/20* (2013.01)

(58) Field of Classification Search
CPC ............ G01R 19/145; G01R 19/16533; G01R 19/16542; G01R 19/16561; G01R 19/16566; G01R 19/16571; G01R 19/16576; G01R 35/00; G01R 35/005; G01R 17/00; G01R 17/02; G01R 17/04; G01R 17/06; G01R 17/10; G01R 17/12; G01R 31/367; H01M 2010/4271; H01M 2220/20; H01M 10/425; H01M 10/48; H01M 10/42; B60L 2240/545; B60L 2240/549; B60L 3/12; B60L 58/12
USPC .......................................................... 429/61
See application file for complete search history.

(56) References Cited

U.S. PATENT DOCUMENTS

| | | | |
|---|---|---|---|
| 8,099,180 B2 | 1/2012 | Schoch | |
| 9,132,745 B1 | 9/2015 | Lee | |
| 11,527,780 B2 | 12/2022 | Rinaldo et al. | |
| 12,057,557 B2 | 8/2024 | Rinaldo et al. | |
| 2003/0184307 A1 | 10/2003 | Kozlowski | |
| 2009/0091296 A1 | 4/2009 | Desprez | |
| 2009/0296397 A1 | 12/2009 | Gibboney, Jr. | |
| 2013/0041538 A1* | 2/2013 | Jin ..................... | G01R 31/382 |
| | | | 324/427 |
| 2015/0028808 A1 | 1/2015 | Bernardi et al. | |
| 2015/0231985 A1 | 8/2015 | Li | |
| 2016/0077160 A1 | 3/2016 | Wampler, II et al. | |

FOREIGN PATENT DOCUMENTS

| | | |
|---|---|---|
| CN | 104009512 A | 8/2014 |
| CN | 105122074 A | 10/2014 |
| CN | 104820178 A | 8/2015 |
| CN | 104820189 A | 8/2015 |
| CN | 104868519 A | 8/2015 |
| CN | 105301509 A | 2/2016 |
| CN | 105378497 A | 3/2016 |
| EP | 1153311 A1 | 11/2001 |
| WO | 0031557 A1 | 6/2000 |
| WO | 03067735 A1 | 8/2003 |

OTHER PUBLICATIONS

Peng Simin, et. al., "An Equivalent Circuit Model of Series Battery System Based on Parameter Corrector", Electric Technology, vol. 34, No. 24, Dec. 20, 2015, pp. 59-63.
Doyle, M. et al.; "Modeling of Galvanostatic Charge and Discharge of the lithium/Polymer/Insertion Cell;" Journal of Electrochemical Society; Oct. 1992; 39 pages.
Harris, S.J. et al.; "Direct in situ measurements of Li transport in Li-ion battery negative electrodes;" Chemical Physics Letters; Nov. 14, 2009; 10 pages.
Hu, X. et al.; "A comparative study of equivalent circuit models for Li-ion batteries;" Journal of Power Sources; Aug. 16, 2011; 9 pages.
Liaw et al.; "Modeling of lithium ion cells—A simple equivalent-circuit model approach;" Science Direct; Nov. 2004; 5 pages.
Piett, G.L.; "Equivalent-Circuit Cell Models;" Modeling, Simulation and Identification of Battery Dynamics; 2011; 7 pages.

* cited by examiner

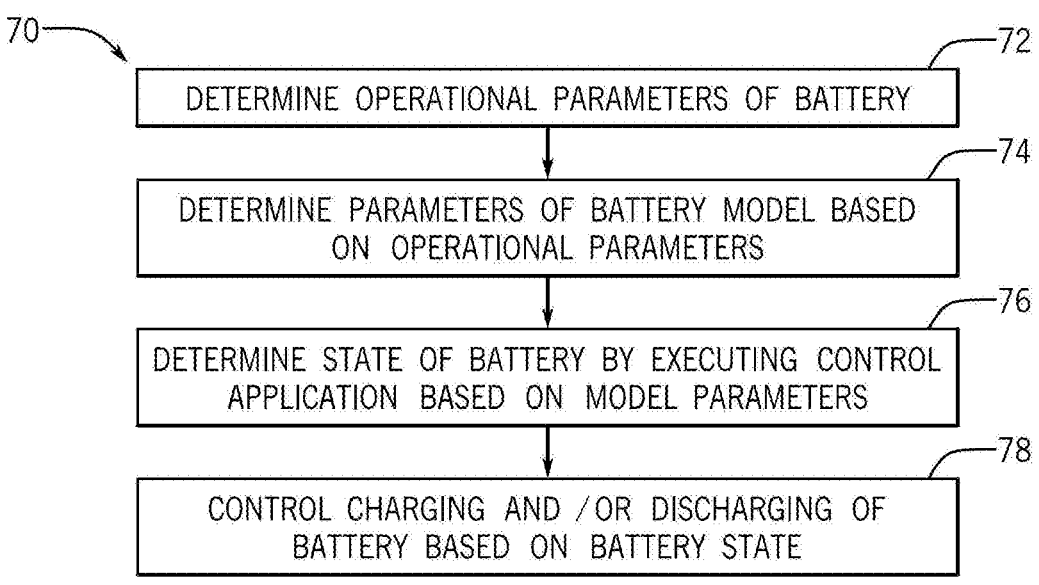

70

72 ─ DETERMINE OPERATIONAL PARAMETERS OF BATTERY

74 ─ DETERMINE PARAMETERS OF BATTERY MODEL BASED ON OPERATIONAL PARAMETERS

76 ─ DETERMINE STATE OF BATTERY BY EXECUTING CONTROL APPLICATION BASED ON MODEL PARAMETERS

78 ─ CONTROL CHARGING AND/OR DISCHARGING OF BATTERY BASED ON BATTERY STATE

FIG. 5

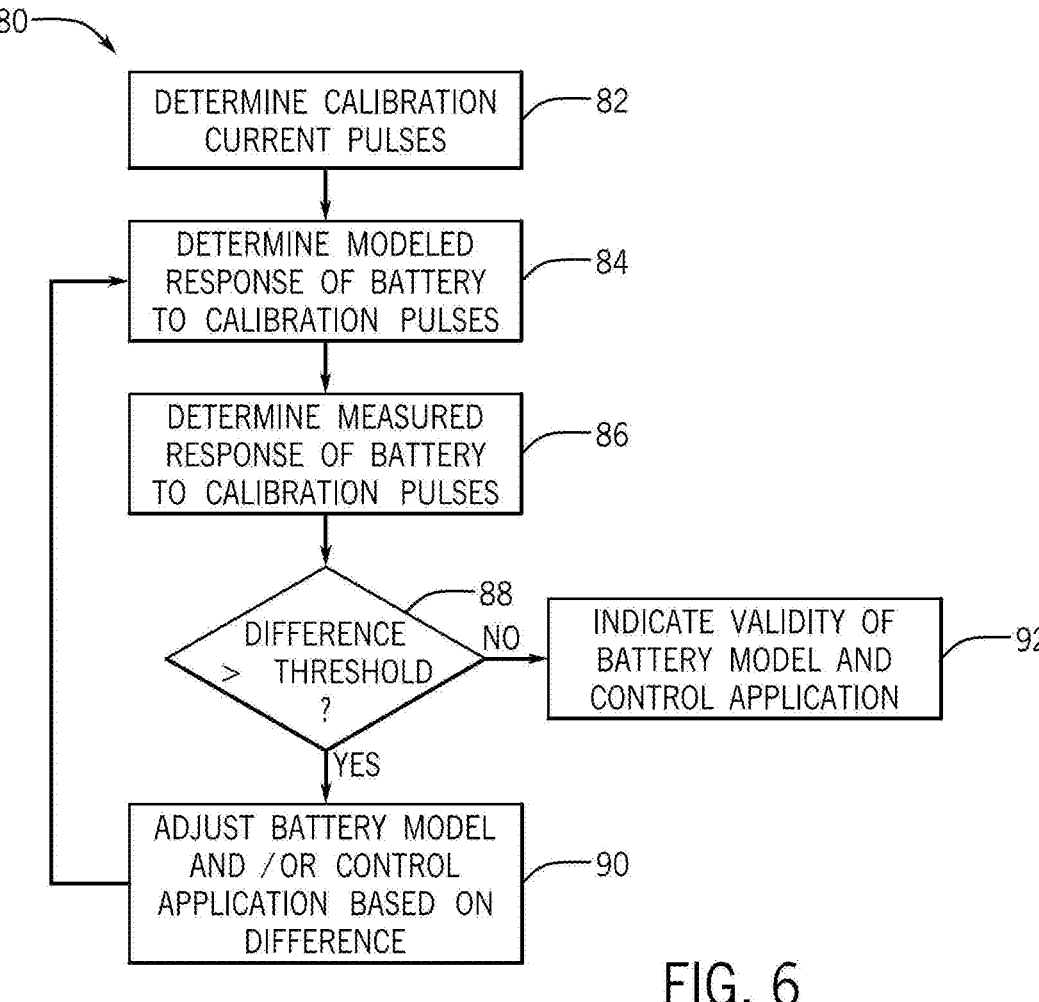

80

82 ─ DETERMINE CALIBRATION CURRENT PULSES

84 ─ DETERMINE MODELED RESPONSE OF BATTERY TO CALIBRATION PULSES

86 ─ DETERMINE MEASURED RESPONSE OF BATTERY TO CALIBRATION PULSES

88 ─ DIFFERENCE > THRESHOLD ?

NO ─ 92 ─ INDICATE VALIDITY OF BATTERY MODEL AND CONTROL APPLICATION

YES

90 ─ ADJUST BATTERY MODEL AND/OR CONTROL APPLICATION BASED ON DIFFERENCE

BATTERY MODEL AND CONTROL APPLICATION CALIBRATION SYSTEMS AND METHODS

CROSS REFERENCE TO RELATED APPLICATIONS

This application is a continuation of U.S. patent application Ser. No. 18/079,125, entitled "BATTERY MODEL AND CONTROL APPLICATION CALIBRATION SYS-TEMS AND METHODS," filed Dec. 12, 2022, issued as U.S. Pat. No. 12,057,557; which is a continuation of U.S. patent application Ser. No. 16/338,966, entitled "BATTERY MODEL AND CONTROL APPLICATION CALIBRA-TION SYSTEMS AND METHODS," filed Apr. 2, 2019, issued as U.S. Pat. No. 11,527,780; which is a U.S. National Stage Application under 35 U.S.C. § 371 of International Application No. PCT/US17/56367, entitled "BATTERY MODEL AND CONTROL APPLICATION CALIBRA-TION SYSTEMS AND METHODS," filed Oct. 12, 2017; which claims priority to and the benefit of U.S. Provisional Application No. 62/407,487, entitled "METHODS FOR STATE-OF-FUNCTION AND ASSOCIATED CELL MODEL VALIDATION," filed Oct. 12, 2016; all of which are incorporated herein by reference in their entireties for all purposes.

BACKGROUND

The present disclosure generally relates to battery systems and, more specifically, to battery control systems utilized in battery systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclo-sure. Accordingly, it should be understood that these state-ments are to be read in this light, and not as admissions of prior art.

Electrical systems often include a battery system to cap-ture (e.g., store) generated electrical energy and/or to supply electrical power. In fact, battery systems may be included in electrical systems utilized for various applications. For example, a stationary power system may include a battery system that receives electrical power output by an electrical generator and stores the electrical power as electrical energy. In this manner, the battery system may supply electrical power to electrical loads using the stored electrical energy.

Additionally, an electrical system in an automotive vehicle may include a battery system that supplies electrical power, for example, to provide and/or supplement the motive force (e.g., power) of the automotive vehicle. For the purpose of the present disclosure, such automotive vehicles are referred to as xEV and may include any one, any variation, and/or any combination of the following type of automotive vehicles. For example, electric vehicles (EVs) may utilize a battery-powered electric propulsion system (e.g., one or more motors) as the primary source of vehicular motive force. As such, a battery system in an electric vehicle may be implemented to supply electrical power to the battery-powered electric propulsion system. Additionally, hybrid electric vehicles (HEVs) may utilize a combination of a battery-powered electric propulsion system and an internal combustion engine propulsion system to produce vehicular motive force. As such, a battery system may be implemented to facilitate directly providing at least a portion of the vehicular motive force by supplying electrical power to the battery-powered electric propulsion system.

Furthermore, micro-hybrid electric vehicles (mHEVs) may use an internal combustion engine propulsion system as the primary source of vehicular motive force, but may utilize the battery system to implement "Stop-Start" techniques. In particular, a mHEV may disable the internal combustion engine when idling and crank (e.g., restart) the internal combustion engine when propulsion is desired. To facilitate implementing such techniques, the battery system may continue supplying electrical power while the internal com-bustion engine is disabled and supply electrical power to crank the internal combustion engine. In this manner, the battery system may indirectly supplement providing the vehicular motive force.

To facilitate controlling its operation, a battery system often includes a battery control system, for example, that determines a battery state, such as state-of-function (SoF), state-of-health (SoH), and/or state of charge (SoC). In some instances, charging and/or discharging of a battery (e.g., battery module, battery pack, or battery cell) may be con-trolled based at least in part on a corresponding battery state determined by the battery control system. For example, magnitude of current and/or voltage supplied to charge the battery may be controlled based at least in part on a charging power limit indicated by its corresponding state-of-function. Thus, at least in some instances, accuracy of a battery state determination by a battery control system may affect opera-tional stability and/or operational efficiency of its corre-sponding battery system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a system may include an automotive battery system having a sensor configured to determine sensor data indicative of a measured operational parameter of a battery cell in the automotive battery system. The system may also include a battery control system commu-nicatively coupled to the sensor. The battery control system may determine a measured battery state by executing a control application based at least in part on the measured operational parameter. The system may also include a design device communicatively coupled to the automotive battery system. The design device may include a processor pro-grammed to determine a modeled operational parameter by supplying a calibration current pulse to a battery model corresponding with the battery cell, determine a modeled battery state by executing a control application based at least in part on the modeled operational parameter, and adjust model parameters of the battery model, the control applica-tion, or both based at least in part on difference between the modeled operational parameter and the measured opera-tional parameter, difference between the modeled battery state and the measured battery state, or both.

In another embodiment, a method to calibrate a battery control system using a design device may involve determin-ing a calibration current pulse and instructing, a battery system corresponding with the battery control system to supply the calibration current pulse to a battery pack. The method may also involve determining, using the design device, a measured response of the battery pack resulting from supply of the calibration current pulse to the battery pack based at least in part on sensor data received from one or more sensors and supplying, using the design device, the calibration current pulse to a battery model corresponding with the battery pack. The method may also involve determining a modeled response resulting from supply of the calibration current pulse to the battery model and adjusting model parameters of the battery model, a control application used to determine the modeled response, or both when the difference between the measured response and the modeled response is greater than a difference threshold. The method may also include storing, using the design device, the battery model, the control application, or both in the battery control system to enable subsequent use during operation of the battery system when difference between the measured response and the modeled response is not greater than the difference threshold.

In yet another embodiment, a tangible, non-transitory, computer-readable medium storing instructions executable by one or more processors of a design device, wherein the instruction comprise instructions to determine a calibration current pulse, to instruct a battery system corresponding with the battery control system to supply the calibration current pulse to a battery pack, to determine a measured response of the battery pack resulting from supply of the calibration current pulse based at least in part on sensor data received from one or more sensors, to supply the calibration current pulse to a battery model corresponding with the battery pack, to determine a modeled response resulting from supply of the calibration current pulse to the battery model, to adjust model parameters of the battery model, a control application used to determine the modeled response, or both when difference between the measured response and the modeled response is greater than a difference threshold, and to store, using the one or more processors, the battery model, the control application, or both in the battery control system to enable subsequent use during operation of the battery system when difference between the measured response and the modeled response is not greater than the difference threshold.

BRIEF DESCRIPTION OF THE DRAWINGS

Various aspects of the present disclosure may be better understood upon reading the following detailed description and upon reference to the drawings, in which:

FIG. 5 is a flow diagram of a process for operating the battery system of FIG. 2, in accordance with an embodiment;

FIG. 6 is a flow diagram of a process for calibrating and/or validating a battery model and a control application, in accordance with an embodiment;

DETAILED DESCRIPTION

Figure 1:
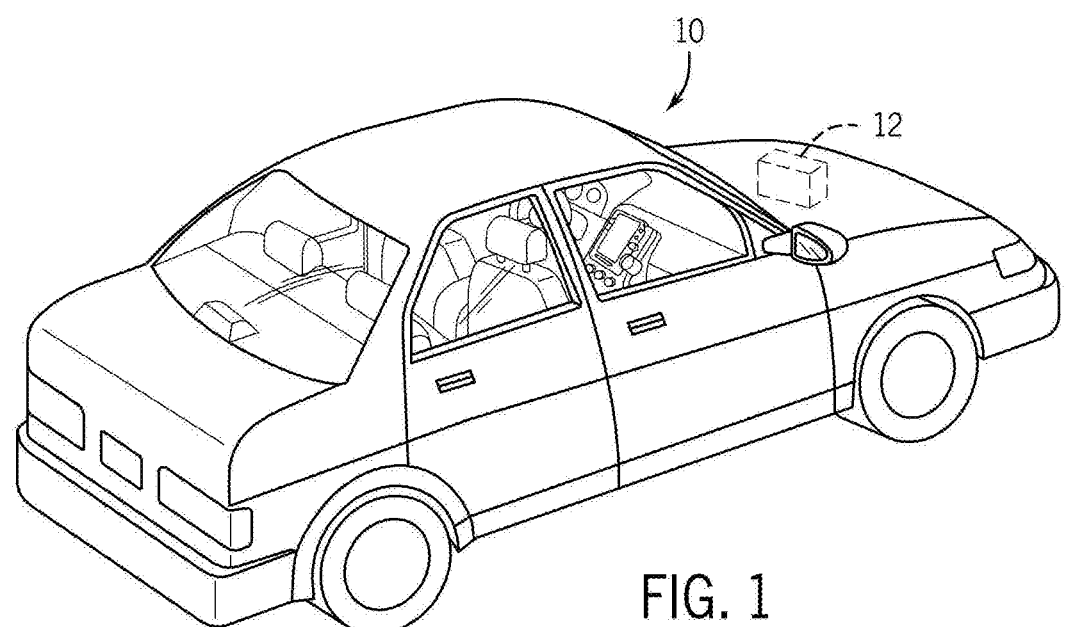
FIG. 1 is a perspective view of an automotive vehicle including a battery system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a battery systems may be implemented to capture (e.g., store) electrical energy generated by one or more electrical generators and/or to supply electrical power to one or more electrical loads using stored electrical energy. Leveraging these benefits, one or more battery system are often included in an electrical system. In fact, battery systems may be utilized in electrical systems implemented for a wide-variety of target applications, for example, ranging from stationary power systems to vehicular (e.g., automotive) electrical systems.

In any case, to facilitate controlling its operation, a battery system often includes a battery control system. In some instances, charging and/or discharging of a battery (e.g., battery module, battery pack, or battery cell) in the battery system may be controlled based at least in part on corresponding battery states, for example, in coordination with a higher-level (e.g., vehicle) control system. Thus, to facilitate controlling operation of the battery system, its battery control system may determine battery states by executing corresponding control applications based at least in part on operational parameters (e.g., voltage, current, and/or temperature) of the battery.

For example, based at least in part on current flow through the battery, the battery control system may execute a state-of-charge (SoC) application to determine (e.g., predict or estimate) open circuit voltage (OCV) of the battery. Additionally or alternatively, based at least in part on current and/or voltage of a battery, the battery control system may execute a state-of-health (SoH) application to determine internal resistance of the battery. Additionally or alternatively, based at least in part on temperature and/or internal resistance of a battery, the battery control system may execute a state-of-function (SoF) application to determine a power (e.g., voltage and/or current) limit for charging and/or discharging the battery.

Thus, to facilitate determining real-time (e.g., measured or actual) battery states, a battery control system may determine operational parameters of the battery system based at least in part on sensor data received from one or more sensors. In other words, the battery control system may determine measured (e.g., actual) operational parameters of the battery system based at least in part on sensor measurements. To facilitate further improving operation of a battery system, in some instances, its battery control system may predict (e.g., estimate) battery states based at least in part on operational parameters determined via a battery (e.g., pack or cell) model, for example, to facilitate selecting between candidate control strategies (e.g., actions) for implementation during a control horizon (e.g., one or more subsequent time steps). In other words, the battery control system may additionally or alternatively determine modeled (e.g., predicted) operational parameters of the battery system based at least in part on the battery model.

Based at least in part on battery state, in some instances, a battery control system may directly control operation of a corresponding battery system by outputting control commands (e.g., signals or data) that instruct the battery system to perform one or more control actions. For example, the battery control system may output a control command that instructs a switching device electrically coupled between a battery in the battery system and an electrical generator (e.g., alternator) to switch from a closed (e.g., electrically connected) position to an open (e.g., electrically disconnected) position when state-of-charge of the battery exceeds a state-of-charge threshold. Additionally or alternatively, a battery control system may facilitate controlling operation of a corresponding battery system by communicating data indicative of battery state to a higher-level control system, which is implemented to control operation of one or more devices (e.g., equipment or machines) external from the battery system. For example, based at least in part on data indicative of battery state-of-function (e.g., charge power limit), a vehicle control unit may output a control command that instructs an alternator to adjust current and/or voltage of electrical power output to the battery system.

Thus, at least in some instances, operation of a battery system may be controlled in different manners when different battery states and/or different operational parameters are determined. As such, when operation of a battery system is controlled based on battery state determined by its battery control system, accuracy of a predicted (e.g., modeled) battery state relative to a corresponding real-time (e.g., measured) battery state and/or accuracy of a modeled operational parameter relative to a measured operational parameter may affect operational reliability and/or operational efficiency of the battery system. For example, when greater than an actual charge power limit, supplying electrical power to a battery in accordance with a determined charge power limit may decrease subsequent lifespan and, thus, reliability of the battery. Additionally or alternatively, when less than an actual state-of-charge, disconnecting electrical power from a battery based on a determined state-of-charge may decrease amount of captured electrical energy and, thus, operational efficiency of the battery system.

In some instances, modeled operational parameters of a battery system may differ from measured operational parameters, for example, due to inaccuracies in the battery model. Thus, a modeled battery state determined based on the modeled operational parameters may also differ from a measured battery state determined based on the measured operational parameters. Moreover, in some instances, the modeled battery state and the measured battery state may differ due to inaccuracies in a corresponding control application. At least in some instances, controlling operation when such discrepancies occur may affect operational reliability and/or operational efficiency of a battery system, for example, by resulting in a battery module being electrically disconnected before being charged up to the state-of-charge threshold, thereby limiting energy storage provided by the battery system and/or ability of the battery system to subsequently crank an internal combustion engine.

Accordingly, the present disclosure provides techniques to facilitate improving operation of a battery system, for example, via offline calibration that improves degree of matching between a modeled operational parameter and a measured operational parameter and/or degree of matching between a modeled battery state and a measured battery state. In some embodiments, a design device may calibrate a battery (e.g., cell) model and/or a control application to be implemented in a battery control system, for example, before deployment in an automotive vehicle or a stationary power system. After calibration has been validated, the battery model and/or the control application may be stored in the battery control system to enable the battery control system to utilize the battery model and/or the control application during operation of the battery system (e.g., online).

In some embodiments, the design device may calibrate by comparing modeled responses to one or more calibration current pulses with corresponding measured responses to the one or more calibration current pulses. In such embodiments, the design device may determine the calibration current pulses based at least in part on current pulses expected to occur during charging and/or discharging of the battery. To determine the modeled response to a calibration current pulse, the design device may supply the calibration current pulse to the battery model, thereby enabling the design device to determine modeled operational parameters from the battery model and corresponding modeled battery states by executing control applications based at least in part on the modeled operational parameters. On the other hand, to determine the measured response to a calibration current pulse, the design device may instruct the battery system to supply the calibration current pulse to its battery, thereby enabling the design device to determine measured operational parameters from sensors coupled to the battery and corresponding measured battery states by executing control applications based at least in part on the measured operational parameters.

Based at least in part on a comparison between the modeled response and the measured response, in some embodiments, the design device may autonomously adjust the battery model and/or a control application. Additionally or alternatively, the design device may facilitate manual tuning (e.g., calibration) of the battery model and/or the control application, for example, by displaying a visual representation (e.g., color coded) of matching degree between the measured responses and the modeled responses. Since matching degree may vary with initial operational parameters of the battery and/or parameters (e.g., duration and/or magnitude) of the calibration current pulse, in some embodiments, the visual representation may be included on a user selectable a graphical user interface (GUI), for example, that enables a user to fine tune the battery model and/or the control application under specific sets of conditions.

The design device may validate the battery model and/or the control application when difference between a modeled response and a measured response is less than a difference threshold. After validation, the battery model and/or the control application may be stored in the battery system and, more particularly, its battery control system. In this manner, the battery control system may utilize the validated battery model and/or the control application online to facilitate controlling operation of the battery system, which at least in some instances may facilitate improving operational reliability and/or operational efficiency of the battery system and, thus, an electrical system in which the battery system is implemented.

To help illustrate, an automotive vehicle 10 with an electrical system, which includes a battery system 12, is shown in FIG. 1. Discussion with regard to the automotive vehicle 10 is merely intended to help illustrate the techniques of the present disclosure and not to limit scope of the techniques. The automotive vehicle 10 may include the battery system 12 and an additional automotive electrical system that may control a vehicle console, an electric motor, and/or a generator. In some cases, the battery system 12 may include some or all of the automotive electrical system. For sake of discussion, the battery system 12 is electrically coupled to the automotive electrical system discussed. In some embodiments, the automotive vehicle 10 may be an xEV, which utilized the battery system 12 to provide and/or supplement vehicular motive force, for example, used to accelerate and/or decelerate the automotive vehicle 10. In other embodiments, the automotive vehicle 10 may be a traditional automotive vehicle 10 that produces vehicular motive force, for example, using an internal combustion engine to accelerate and/or frictional breaks to decelerate.

Figure 2:
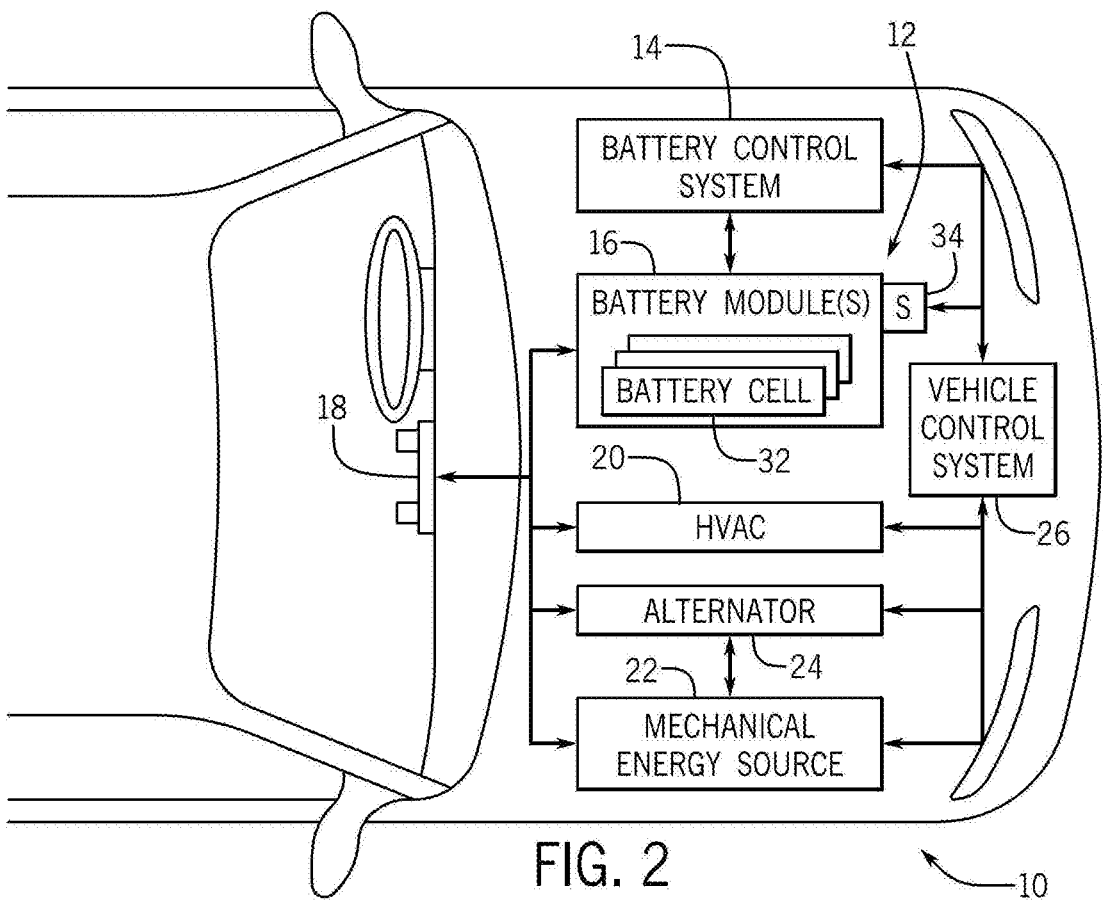
FIG. 2 is a block diagram of the battery system of FIG. 1 including a battery control system, in accordance with an embodiment.

A more detailed view of the battery system 12 and the automotive electrical system in the automotive vehicle 10 is shown in FIG. 2. As illustrated, the battery system 12 includes a battery control system 14 and one or more battery modules 16. Additionally, the automotive electrical system may include a vehicle console 18 and a heating, ventilating, and air conditioning (HVAC) system 20. In some embodiments, the automotive electrical system may additionally or alternatively include a mechanical energy source 22 (e.g., an electric motor) operating in a motor mode.

Additionally, in the depicted automotive vehicle 10, the automotive electrical system may include an electrical source. As illustrated, the electrical source in this embodiment of the automotive electrical system is an alternator 24. The alternator 24 may convert mechanical energy generated by the mechanical energy source 22 (e.g., an internal combustion engine and/or rotating wheels) into electrical energy. In some embodiments, the electrical source may additionally or alternatively include the mechanical energy source 22 (e.g., an electric motor) operating in a generator mode.

As depicted, the automotive vehicle 10 includes a vehicle control system 26. In some embodiments, the vehicle control system 26 may generally control operation of the automotive vehicle 10, which includes the automotive electrical system. Thus, in the depicted automotive vehicle 10, the vehicle control system 26 may supervise the battery control system 14, the battery modules 16, the HVAC 20, the alternator 24, the vehicle console 18, and the mechanical energy source 22, making the vehicle control system 26 similar to a supervisory control system. However, the vehicle control system 26 may additionally control operation of other components other than the components of the automotive electrical system, such as an internal combustion engine propulsion system.

In some embodiments, the battery control system 14 may additionally or alternatively control operation of the battery system 12. For example, the battery control system 14 may determine operational parameters of battery modules 16, coordinate operation of multiple battery modules 16, communicate control commands instructing the battery system 12 to perform control actions, and/or communicate with the vehicle control system 26.

To facilitate controlling operation of the battery system 12, the battery control system 14 may include a processor 28 and memory 30. In some embodiments, the memory 30 may include a tangible, non-transitory, computer readable medium that stores data, such as instructions executable by the processor 28, results (e.g., operational parameters) determined by the processor 28, and/or information (e.g., operational parameters) to be analyzed/processed by the processor 28. Thus, in such embodiments, the memory 30 may include random access memory (RAM), read only memory (ROM), rewritable non-volatile memory (e.g., flash memory), hard drives, optical discs, and the like. Additionally, the processor 28 may include one or more general purpose processing units, processing circuitry, and/or logic circuitry. For example, the processor 28 may include one or more microprocessors, one or more application-specific integrated circuits (ASICs), and/or one or more field programmable gate arrays (FPGAs).

Additionally, to facilitate the storing and supplying of electrical power, the battery system 12 may include one or more battery modules 16. In some embodiments, storage capacity of the battery system 12 may be based at least in part on number of battery modules 16. Additionally, in some embodiments, operational compatibility of the battery system 12 with the automotive electrical system may be based at least in part on configuration of the battery modules 16, for example, in series and/or in parallel to operate in a target voltage domain. According to, in some embodiments, implementation (e.g., number and/or configuration) of the battery modules 16 and, thus, the battery system 12 may vary based at least in part on configuration and/or target application of the automotive electrical system.

In some embodiments, the number and/or configuration of battery modules 16 of the battery system 12 may vary based at least in part on target application. For example, in the depicted automotive vehicle 10, the battery system 12 includes one battery module 16. It is noted that the battery system 12 may include multiple battery modules 16 to facilitate operational compatibility with multiple voltage domains. For example, a first battery module 16 may operate (e.g., receive and/or supply) using electrical power in a first (e.g., high or 48 volt) voltage domain. On the other hand, a second battery module, not depicted, may operate using electrical power in a second (e.g., low or 12 volt) voltage domain. In other words, in other embodiments, the battery system 12 may include two or more battery modules 16.

In any case, each battery module 16 may include one or more battery cells 32 connected in series and/or parallel with terminals of the battery module 16. In particular, a battery cell 32 may store electrical energy and/or output electrical power via one or more electro-chemical reactions. For example, in some embodiments, the battery cells 32 may include lithium-ion battery cells, lead-acid battery cells, or both.

In some embodiments, the battery control system 14 may monitor operation of the battery module 16 via one or more sensors 34. A sensor 34 may transmit sensor data to the battery control system 14 indicative of real-time (e.g., measured) operational parameters of the battery modules 16. Thus, in some embodiments, a battery system may include one or more voltage sensors, one or more temperature sensors, and/or a variety of additional or alternative sensors. For example, in the depicted embodiment, the battery control system 14 may receive sensor data from the sensor 34 indicative of the voltage (e.g., terminal voltage) of the battery module 16. The battery control system 14 may process the sensor data based on instructions stored in memory 30.

Figure 3:
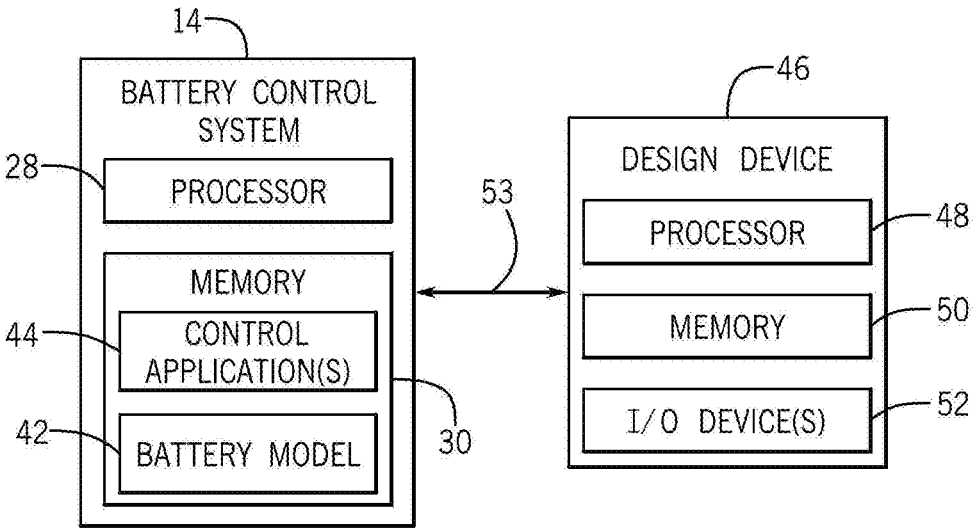
FIG. 3 is a block diagram of the battery control system of FIG. 2 communicatively coupled with a design device, in accordance with an embodiment.

For example, the battery control system 14 may store a battery model 42 and a control application 44 as executable instructions in memory 30 as illustrated in FIG. 3. As discussed above, the battery control system 14 may execute the control application 44 to determine the state of the battery module 16 and/or the state of the battery system 12. For example the battery control system 14 may execute a state-of-function (SoF) control application 44 to determine a discharge current limit and/or a charge current limit based at least in part on a terminal voltage indicated by sensor data received from the sensor 34. Based on the control application 44, the battery control system 14 may instruct the battery system 12 to perform one or more control actions and/or operate in different manners. For example, the battery control system 14 may instruct a switching device to electrically disconnect if a determined discharge current exceeds a threshold stored in memory 30.

In some embodiments, the battery control system 14 may use the battery model 42 to predict the operation of the battery module 16 and/or the battery system 12. It is noted that while the battery model 42 may model the behavior of the battery system 12, the battery cells 32, and/or the battery modules 16, for ease of discussion the embodiment of the battery module 16 will be described. Application requirements may determine what specific battery model 42 best models the battery module 16 as long as the battery model 42 is computationally facile while having a high degree of accuracy and predictive capability.

As such, the battery control system 14 may use the battery model 42 to provide modeled operational parameters in addition or as alternative to operational parameters measured by a sensor 34. The battery control system 14 may input indications of certain operational parameters to the battery model 42. Through inputting particular operational parameters to the battery model 42, the battery control system 14 receives indications of parameters outputs. For example, the battery control system 14 may receive a terminal voltage measurement from the sensor 34 and using that terminal voltage measurement in the battery model 42, may receive a value for the open circuit voltage as an output from the battery model 42. In some embodiments, using the battery model 42 to predict and/or model battery module 16 behavior may facilitate reducing implementation associated cost, for example, by enabling a reduction in number of sensors 34 implemented in a battery system 12.

The memory 30 may store a variety of battery models 42. The one or more of the variety of the battery models 42 may predict the operation of the battery module 16 alone or in combination. Through the battery control system 14 controlling the battery system 12 based on the modeled parameters, any errors in the battery model 42 or the modeled parameters may propagate into the behavior of the battery system 12. Therefore, a design device 46 may perform a calibration of the battery model 42 to reduce errors in the battery model 42.

In some embodiments, the design device 46 may calibrate the battery model 42 by adjusting model parameters of the battery model 42 until a particular set of model parameters and the battery model 42 respond in a similar manner as the battery module 16 to the same input. To accomplish this, the design device 46 may include a processor 48, similar to the processor 28, memory 50, similar to the memory 30, and one or more input/output (I/O) devices 52. Thus, the design device 46 may be any suitable electronic device, such as a handheld computing device, a tablet computing device, a notebook computer, a desktop computer, a workstation computer, a cloud-based computing device, or any combination of such devices. The memory 50 may store instructions executable by the processor 48 and/or data to be processed (e.g., analyzed) by the processor 48. In some embodiments, the processor 48 may include one or more general-purpose microprocessors, one or more application specific integrated circuits (ASICs), one or more field programmable gate arrays (FPGAs), or any combination thereof, similar to processor 28.

Furthermore, in some embodiments, I/O devices 52 may enable the design device 46 to interface with various other electronic devices. For example, the I/O devices 52 may communicatively couple the design device 46 via a communication coupling 53. The communication coupling 53 may include a communication network, such as a personal area network (PAN), a local area network (LAN), and/or a wide area network (WAN), thereby enabling the design device 46 to communicate with another electronic device communicatively coupled to the communication network. Additionally or alternatively, the communication coupling 53 may use a communication (e.g., serial or parallel) cable, thereby enabling the design device 46 to communicate with another electronic device communicatively coupled to the communication cable.

In any case, in some embodiments, communication between the design device 46 and the battery control system 14 via communication coupling 53, as depicted, may facilitate determining model parameters of the battery model 42 through validation. When the validation completes, the battery control system 14 may use the determined model parameters in the battery model 42 independent of the design device 46. In other words, the battery control system 14 may use the battery model 42 with the determined model parameters while the automotive vehicle 10 operates without the connection to the design device 46 via the communication coupling 53. The battery model 42 may determine the particular set of model parameters that the design device 46 is to validate.

Figure 4:
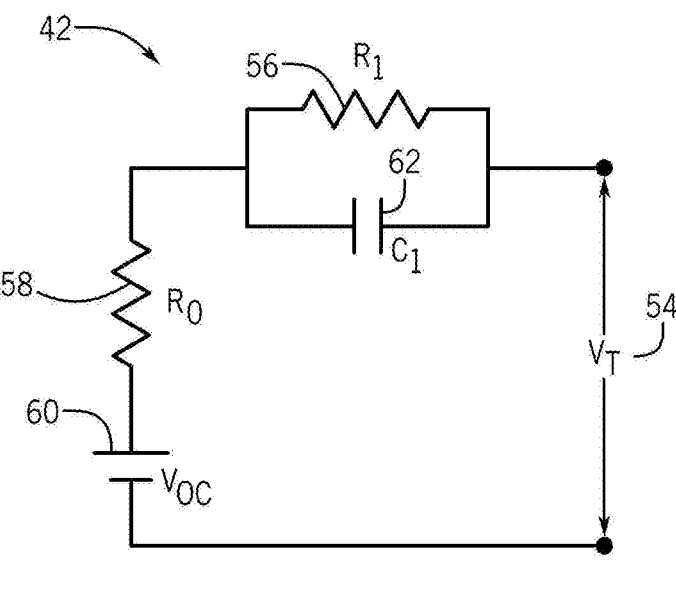
FIG. 4 is a circuit diagram corresponding with a battery model stored in the battery control system of FIG. 3, in accordance with an embodiment.

FIG. 4 illustrates the battery model 42 of the battery module 16 as a resistor capacitor (RC) equivalent circuit model. In this way, the battery model 42 may represent a battery (e.g., one or more of individual battery cells 38, one or more of battery modules 16, battery system 12). The battery model 42 relates the model parameters (e.g., a resistance 56, a resistance 58, and a capacitance 62) to the operational parameters (e.g., terminal voltage 54, terminal current, and battery temperature) measured by one or more sensor 34. Additionally, the battery model 42 may provide a mechanism to estimate the parameters of the battery model 42 (e.g., open circuit voltage 60) in real-time during operation of the automotive vehicle 10.

In the battery model 42, the resistance 58 (e.g., $R_0$) may represent an ohmic resistance of a current path of the battery module 16, the resistance 56 (e.g., $R_1$) may represent a charge transfer resistance of the battery module 16, and the capacitance 62 (e.g., $C_1$) may represent a double layer capacitance of the battery module 16. In the battery model 42, the resistances 56 and 58 and the capacitance 62 are generally design parameters of the battery module 16 which depend on an initial open circuit voltage, an initial temperature, and an initial current magnitude and direction. Alternatively, the open circuit voltage 60, used to determine the state of the battery module 16, is generally a parameter of the battery module 16 that may depend on a final temperature and a final current magnitude and direction, both determined from the design parameters and the operational parameters applied to the battery model 42. That is, as the battery module 16 is charged and discharged over a time, the open circuit voltage 60 may increase and decrease over the time. In this way, the accuracy of the battery model 42, and subsequently the accuracy of the open circuit voltage 60 parameter, may increase through validation of the model parameters due to the dependence of the value of the parameter upon the model parameters. Through this, the battery model 42 with validated model parameters may more accurately model the battery module 16 than a battery model 42 model parameters, for example, compared to before calibration and/or validation.

To help illustrate, an example of a process 70 for using operational parameters of the battery (e.g., battery module 16) to control the behavior of the battery is described in FIG. 5. Generally, the process 70 includes determining operational parameters of the battery (process block 72), determining parameters of the battery model based on the operational parameters (process block 74), determining the state of the battery by executing control application based on model parameters (process block 76), and controlling the charging and/or discharging of the battery based on the battery state (process block 78). In some embodiments, the process 70 may be implemented by executing instructions stored in a tangible, non-transitory, computer-readable medium, such as the memory 30, using processing circuitry, such as the processor 28.

Thus, in some embodiments, the battery control system 14 may determine the operational parameters of the battery (process block 72). The battery control system 14 may receive signals indicative of the operational parameters to the processor 28 and/or to memory 30 from the sensor 34. For example, the battery control system 14 may receive signals indicative of a terminal voltage 54, a terminal current, and a temperature of the battery from the sensor 34. The type of measurement the battery control system 14 receives from the sensor 34 depends on the type of measurements used in the battery model 42. One battery model 42 may utilize one set of operational parameters and a second battery model may utilize a second set of operational parameters.

After the battery control system 14 receives the operational parameters, the battery control system 14 may determine the parameters of the battery model 42 based on the operational parameters (process block 74). The parameters of the battery model 42 may be the values that the battery control system 14 uses to determine the state of the battery. In this manner, the parameters of the battery model 42 may facilitate determining parameters based on the directly measured operational parameters. For example, as discussed above, the battery control system 14 may determine (e.g., calculate) the open circuit voltage 60 (e.g., the parameter of the battery model 42) from the terminal voltage 54, the terminal current, and the operating temperature (e.g., the operational parameters of the battery module 16).

After the design device 46 determines the parameters of the battery model 42, the battery control system 14 may determine the state of the battery by executing the control application 44 based on the model parameters (process block 76). The control application 44 may mathematically or otherwise represent a relationship and/or correlation between the state of the battery module 16, the parameters of the battery model 42, and the operational parameters of the battery module 16. In some embodiments, a state-of-function (SoF) control application 44 may be executed using values for the terminal voltage 54, the resistances 56 and 58, and the open circuit voltage 60 to determine a discharge current limit and/or a charge current limit. In those embodiments, a difference between the open circuit voltage 60 and the terminal voltage 54 may be divided by a sum of resistances 56 and 58 to determine a discharge and/or charge current limit.

Through executing the control application 44, the battery control system 14 may determine the state of the battery. Examples of possible applications saved as the control application 44 include but are not limited to the SoF application, a state-of-health (SoH) application, and a state-of-charge (SoC) application. The SoF application, as described earlier, may determine the battery discharge and/or a charge current limit state. The SoH application may determine a general state of health of the battery, as in, how well suited the battery state is for delivering the stored electrical power. The SoC application may determine a percentage charged for the battery state. That is, the SoC application may determine the amount of stored energy in the battery divided by the total energy storage capacity of the battery. Using the determined battery state, the battery control system 14 may control the operation of the battery A control system (e.g., battery control system 14 and/or vehicle control system 26) may control operation of the battery through decisions and/or actions based on the determined battery state. As discussed earlier, the battery state may be determined from the battery model 42 and the control application 44. Errors in the battery control system 14 (e.g., sensor 34 measurement errors, battery model 42 errors, and/or control application 44 errors) may propagate through and affect operational control of the battery. Of the listed examples, the design device 46 may operate to correct and/or reduce the battery model 42 and/or control application 44 errors through the determined model parameters. Determined model parameters of the battery model 42 nay facilitate achieving a particular model response. Therefore, the design device 46 may operate to improve, calibrate, and/or validate the battery model 42 through validation of model parameters before the deployment of the battery control system 14.

To help illustrate, an example of a process 80 for calibrating and/or validating a battery model 42 is described in FIG. 6. Generally, the process 80 includes determining the calibration current pulses (process block 82), determining the modeled response of the battery to the calibration current pulses (process block 84), determining the measured response of the battery to the calibration current pulses (process block 86), and determining if a difference between the modeled and measured response of the battery exceeds a threshold (decision block 88). If the threshold is exceeded, adjusting the battery model and/or the control application based on the difference (process block 90) and determining for an additional time the modeled response of the battery to the calibration pulses. If the threshold is not exceeded, indicating the validity of the battery model and control application (process block 92). In some embodiments, the process 80 may be implemented by executing instructions stored in a tangible, non-transitory, computer-readable medium, such as the memory 50, using processing circuitry, such as the processor 48.

Thus, in some embodiments, the design device 46 may determine the calibration current pulses (process block 82). In some embodiments, a calibration current pulse may be a controlled input with defined characteristics, which the design device 46 uses to determine how close the response of the battery model 42 is to the response of the battery to the same input. Different characteristics may define the calibration current pulse, such as a value for the initial percent charged of the battery, a value for the initial battery temperature, a value for the duration of time of the current pulse, and a value of the current transmitted through the pulse. The design device 46 may select the calibration current pulse from one of multiple candidate current pulses. The design device 46 may derive the calibration current pulse from hybrid pulse power characterization (HPPC) pulse data during the measurement of dynamic power capability during both discharge and charge events. Additionally or alternatively, the design device 46 may derive the calibration current pulse from expected/estimated driving profile.

To elaborate, particular current pulse profiles may occur often during actual operation of the battery. In this way, a calibration/validation method may include using a calibration current pulse that mimics a more likely to occur current pulse than one that is less likely to occur during operation of the battery. For example, in an expected/estimated driving profile, the average operation of the battery may be less likely to involve rapidly accelerating for a long period of time and may be more likely that the average operation involves rapidly accelerating for a short period of time. Thus, the calibration current pulse may mimic the pulse that corresponds to rapidly accelerating for a short period of time, and thus may be prioritized to ensure that the model is accurately representing the more often occurring current pulse during operation.

Figure 7:
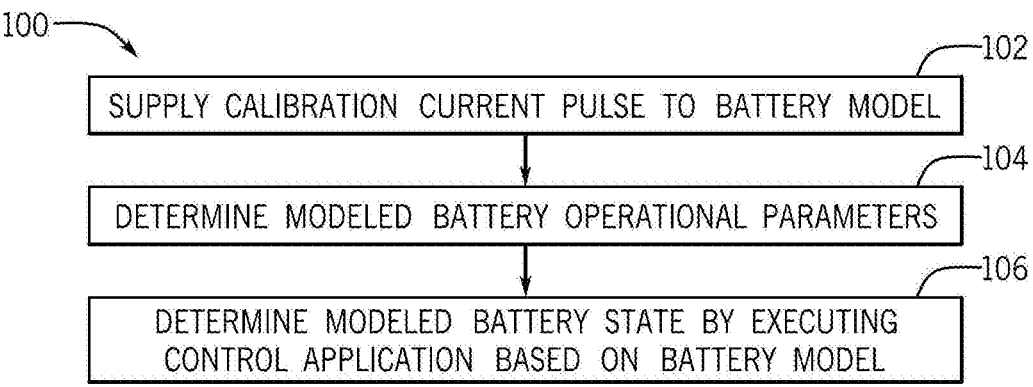
FIG. 7 is a flow diagram of a process for determining a modeled battery response, in accordance with an embodiment.

After a calibration current pulse is determined, the design device 46 may determine the modeled response of the battery to the calibration pulse (process block 84). To help illustrate, an example of a process 100 for determining the modeled response of the battery to a calibration pulse is described in FIG. 7. Generally, the process 100 includes supplying a calibration current pulse to the battery model (process block 102), determining modeled battery operational parameters (process block 104), and determining modeled battery state by executing a control application based on the battery model (process block 106). In some embodiments, the process 100 may be implemented by executing instructions stored in a tangible, non-transitory, computer-readable medium, such as the memory 50, using processing circuitry, such as the processor 48.

Thus, in some embodiments, the design device 46 may supply the calibration current pulse to the battery model 42, for example, via the battery control system 14 (process block 102). The design device 46 may transmit an indication of the calibration current pulse to the battery model 42 via communication coupling 53 and the battery control system 14. The battery control system 14 receives the indication of the calibration current pulse via the communication coupling 53. Through the processor 28, the battery control system 14 applies a signal indicative of the calibration current pulse (e.g., has the same characteristics as were transmitted/defined by the design device 46) to the battery model 42. The battery model 42 receives the signal indicative of the calibration current pulse at the terminals as a modeled current (e.g., terminal current).

Additionally, the battery control system 14 may determine the modeled battery operational parameters after receiving indication of the calibration current pulse (process block 104). For example, the battery control system 14 may apply the calibration current pulse to the battery model 42 to determine modeled operational parameters (e.g., terminal voltage 54). The battery control system 14 may apply the operational parameters to determine the parameters of the battery model 42. The battery control system 14, to successfully determine the parameters of the battery model 42, may retrieve values for the initial model parameters from the memory 30. Additionally or alternatively, the battery control system 14 may receive indication from the design device 46 via the communication coupling 53 for the initial model parameters. Through the battery model 42 and the initial model parameters, the calibration current pulse results in modeled parameters of the battery (e.g., open circuit voltage 60). The battery control system 14 via processor 28 may store the modeled parameters of the battery model 42 necessary to determine the battery state through the control application 44 as the battery model 42 parameters in the memory 30.

Based on the battery model parameters, the battery control system 14 may determine the modeled battery state by executing the control application 44 (process block 106). The battery control system 14 may execute the control application 44 via processor 28. The executed control application 44 uses the parameters, the operational parameters, and the model parameters to determine the battery state (e.g., discharge and/or charge current limit). The battery control system 14 may transmit the modeled battery state via the communication coupling 53 to the design device 46. Additionally, the design device 46 may store the modeled battery state into memory 50 for future processing. The modeled battery state stored in memory is the modeled response of the battery to the calibration pulses.

Returning to the process 80 of FIG. 6, in this manner described with the process 100, the design device 46 determines the modeled response of the battery to the calibration pulses. As described above, the modeled response of the battery to the calibration pulses may be compared against a measured response of the battery to the calibration pulses as a method to validate a battery model 42. Thus, the design device 46 may determine the measured response of the battery to the calibration pulse (process block 86).

Figure 8:
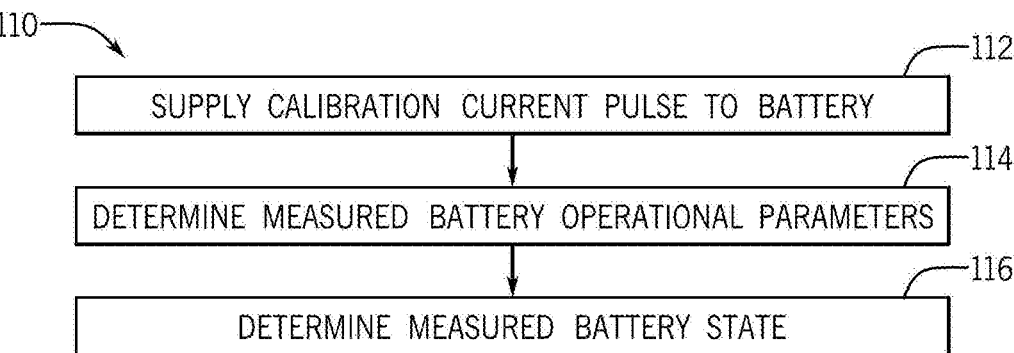
FIG. 8 is a flow diagram of a process for determining a measured battery response, in accordance with an embodiment.

To help illustrate, an example of a process 110 for determining the measured response of the battery to the calibration pulse is described in FIG. 8. Generally, the process 110 includes supplying a calibration current pulse to a battery (process block 112), determining measured battery operational parameters (process block 114), and determining a measured battery state (process block 106). In some embodiments, the process 110 may be implemented by executing instructions stored in a tangible, non-transitory, computer-readable medium, such as the memory 50, using processing circuitry, such as the processor 48.

Thus, in some embodiments, the battery control system 14 may supply the calibration current pulse to the battery (process block 112). The design device 46 may transmit an indication of the calibration current pulse to the battery control system 14 via the communication coupling 53. After the battery control system 14 receives the indication, the battery control system 14 may instruct the battery system 12 and/or an electrical system to supply the calibration current pulse to the battery. The calibration current pulse delivered to the battery has the same characteristics as the calibration current pulse transmitted to the battery model 42. In this way, design device 46 may compare the responses from the battery model 42 and the battery and adjust the battery model 42 to better fit the battery response. To determine the response from the battery, the battery control system 14 may determine the operational parameters of the battery.

The battery control system 14 may determine the measured battery operational parameters through communication with one or more sensors 34 (process block 114). After the calibration current pulse transmits, the sensors 34 may indicate battery operational parameters via sensor data. The battery operational parameters measured by the sensor 34 may match the operational parameters in type of measurement (e.g., voltage measurement, temperature measurement). The sensor 34 may transmit signals indicative of the measurement to the battery control system 14. The battery control system 14 may store the indications of the measurement in the memory 30 for future retrieval.

After the battery control system 14 determines the measured battery operational parameters, the battery control system 14 may determine the measured battery state (process block 116). The battery control system 14 may determine the measured battery state either through direct measurement or through calculation via measured values. For example, the battery control system 14 may determine the battery state either through a power measurement or through coulomb (e.g., current) counting methods typically used for battery state determinations.

Additionally or alternatively, the battery control system 14 may determine the battery state through measuring the battery model 42 parameters directly (e.g., parameters, operational parameters, model parameters). The executed control application 44 may use the battery model 42 parameters to determine the battery state. The battery control system 14 may transmit the determined measured battery state via communication coupling 53 to the design device 46. The design device 46 may store the measured battery state into memory 50 for further processing. The measured battery state stored in memory 50 is the measured response of the battery to the calibration current pulses.

Returning to the process 80 of FIG. 6, in this manner described with the process 110, the design device 46 may determine the measured response of the battery to the calibration pulses. As described above, the modeled response of the battery to the calibration pulses may be compared against a measured response of the battery to the calibration pulses as a method to validate a battery model 42. After the design device 46 determines the measured response of the battery to the calibration pulse, the design device 46 may determine if the difference between the measured response and the modeled response of the battery exceed a difference threshold (decision block 88).

The design device 46 may determine if the difference between the measured response and the modeled response of the battery exceed a threshold through comparing the difference to the threshold stored in the memory 50. If the battery was an ideal electrical system, the design device 46 may determine if the measured response is the same as the modeled response. Due to electrical and physical variations, the design device 46 may use a tolerance threshold to determine if the difference between the measured and modeled responses exceeds the threshold (e.g., defined range). The processor 48 may store the threshold in tangible memory in memory 50. The processor 48 may read the threshold from memory 50 in preparation for the comparison via the processor 48.

If the difference exceeds the threshold, the design device 46 adjusts the battery model 42 and/or control application 44 based on the difference (process block 90). The design device 46 may adjust the battery model 42 and/or control application 44 based on the difference or based on programmed methods of adjusting the battery model 42 and/or control application 44. In this way, a difference between the measured battery state and the modeled battery state that exceeds the threshold by a large margin may result in a larger adjustment than a difference that only exceeds the threshold by a small margin. Adjustments to the battery model 42 and/or calibration model 44 are made through the adjusting of the model parameters.

One method of adjustment may additionally or alternatively include convoluting (e.g., grouping) the calibration current pulses into a set of instances of current pulses organized by characteristics. When the design device 46 collects the total response by the battery and by the battery model 42, the design device 46 may optimize the model parameters based upon the individual responses in light of other instances of calibration current pulses. Through comparing calibration current pulses against other calibration current pulses, relationships between the validation attempts and responses may be tracked.

In this way, trade-offs in performance may exist. The design device 46 may base adjustments to the battery model 42 and/or the calibration model 44 on such trade-offs that may occur from a design change (e.g., change in model parameters). For example, in a first current pulse, the difference between the measured and modeled open circuit voltages 60 may not exceed a corresponding difference threshold while the difference between the measured and modeled battery state exceeds a corresponding difference threshold. A trade-off may exist where when the battery model 42 is adjusted to decrease the difference between the measured battery state and modeled battery state, the result is that the difference between the measured and modeled open circuit voltages 60 may exceed the difference threshold in the subsequent validation attempts (e.g., cycles or passes).

Figures 9, 10:
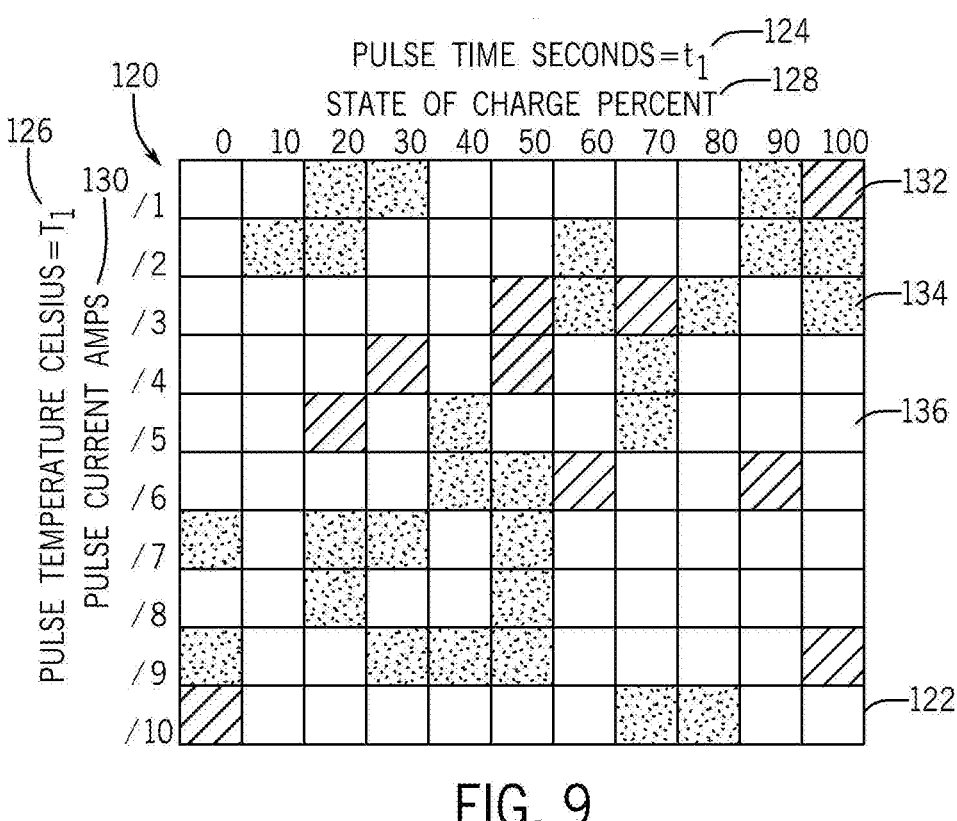
FIG. 9 is a graphical representation of matching degree between modeled battery responses and measured battery responses to first calibration current pulses, in accordance with an embodiment.
FIG. 10 is a graphical representation of matching degree between modeled battery responses and measured battery responses to second calibration current pulses, in accordance with an embodiment.

Graphical representations may facilitate analyzing the trade-offs between calibration current pulse instances, as illustrated in FIG. 9 and FIG. 10. FIG. 9 illustrates a graphical representation 120 that plots a collection of individual calibration current pulses 122 convoluted into a set of instances of calibration current pulses organized by pulse characteristics. The calibration current pulses of the graphical representation 120 all had a pulse duration of $t_1$ seconds 124, had an initial battery temperature of $T_1$ 126. The design device 46 may plot the calibration current pulses based on the initial battery percentage charged 128 and the value of the current transmitted through the pulse 130. The graphical representation 120 visualizes (e.g., color coded) the individual calibration current pulse (e.g., individual calibration current pulse 122) and how close the difference between the modeled and measured battery state was to the threshold. In some embodiments, visualization depends upon statistical measures of fit. In other embodiments, the visualization depends upon a coefficient of determination (e.g., $r^2$) between the measured and modeled responses where a good rating 132, a better rating 134, and a best rating 136 could be bracketed by ranges of the coefficient of determination (e.g., $r^2 > 0.95$=best, $0.95 > r^2 > 0.9$=better, $r^2 < 0.9$=good).

Similarly, FIG. 10 illustrates a similar graphical representation 120 but with changed characteristics. In the graphical representation 120, the collection of calibration current pulses all had a pulse duration of $t_2$ seconds 138 and an initial battery temperature of $T_2$ 140. Similar to FIG. 9, the calibration current pulses are plotted based on the initial battery percentage charged 128, the value of the current transmitted through the pulse 130. The visualization of the graphical representation 120 shows the good rating 132, the better rating 134, and the best rating 136 based on how close the difference between the modeled and measured response of the battery was to the threshold. The design device 46 may display the graphical representation 120 to facilitate in adjusting the battery model 42 and/or the control application 44. As such, the design device 46 may receive indication to select an individual calibration current pulse 122 via I/O devices 52 (e.g., input via mouse or keyboard key). When the individual calibration current pulse 122 is selected, the design device 46 may operate to display via I/O device 52 (e.g., monitor, graphics display) additional graphical representations of the modeled and measured response events. In some embodiments, the additional graphical representation may include a chart comparing the current of the battery over time whereas the graphical representation may compare the performance of the measured response to the performance of the modeled response. The additional graphical representations of the responses may facilitate in identifying the trade-offs, as discussed earlier, since the additional representations of the response provide additional granularity of measurement.

Returning to discussion in FIG. 6, through the graphical representations 120, the additional graphical representations, and/or the programmed methods, the design device 46 may adjust the battery model 42 and/or the control application 44. After the design device 46 adjusts the model parameters for battery model 42 and/or the control application 44, taking into account the trade-offs that exist with the adjustment, the design device 46 may transmit the adjusted model parameters to the battery control system 14 via the communication coupling 53. The battery control system 14 via processor 28 stores the adjusted model parameters into the battery model 42. After the adjusted model parameters are stored, the design device 46 may continue to determine the modeled response of the battery to calibration pulses (process block 84). In this manner, the process 80 may repeat until the difference between the modeled and the measured battery response to the calibration pulses does not exceed the threshold.

Once the difference does not exceed the difference threshold, the design device 46 may indicate validity of battery model 42 and control application 44 (process block 92). The design device 46 may transmit an indication of validity of battery model 42 and control application 44 via the I/O devices 52. For example, the indication of validity of battery model 42 and control application 44 may transmit to a visual display. Additionally or alternatively, the indication may be stored in battery control system 14. In some embodiments, the battery control system 14, upon receiving the indication, finalizes and stores the most recent determined/validated model parameters to the memory 30. In this way, the battery control system 14 may access the validated battery model 42 during operation of the battery without depending on the design device 46. As such, the validated battery model 42 may minimize the error contribution to the battery control system 14 from the battery model 42 and the control application 44.

Thus, the technical effects of the present disclosure include facilitating improved charging and/or discharging of a battery based on the battery state, for example, by improving the method of validating the modeled performance of a battery. The method describes a validating the performance of a battery model and adjusting the battery model based on graphical representations of calibration current pulses.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A system comprising:
a battery system comprising a battery control system communicatively coupled to a sensor for sensing, the battery control system being configured to determine an actual battery state by executing a control application based at least in part on an actual operational parameter; and
a design device communicatively coupled to the battery control system, the design device comprising a processor programmed to:
determine a predicted operational parameter by an application of a calibration stimulus to a battery model corresponding with the battery system;
determine a predicted battery state by executing a control application based at least in part on the predicted operational parameter; and
adjust model parameters of the battery model, the control application, or both based on a difference between the predicted operational parameter and the actual operational parameter, a difference between the predicted battery state and the actual battery state, or both.

2. The system of claim 1, wherein the control application comprises a state-of-function (SoF) application executable by the processor to determine a charging power limit, a discharging power limit, or both associated with a battery of the battery system.

3. The system of claim 1, wherein the predicted battery state or the actual battery state describes a value representing a discharge current limit of the battery system, stored energy in the battery system divided by a total energy storage capacity of the battery system, or a capability of the battery system to deliver the stored energy.

4. The system of claim 1, wherein characteristics of the calibration stimulus are derived from characterization data during sensing of dynamic power capability during both discharge and charge events.

5. The system of claim 1, wherein the adjusting model parameters of the battery model, the control application, or both comprises adjusting the model parameters based at least in part on a graphical representation of the calibration stimulus including a first stimulus and a second stimulus derived from the calibration stimulus and organized a current value, an initial percent charged value, and an initial temperature value.

6. The system of claim 1, wherein the battery control system is configured to determine the actual operational parameter for the battery system, by an application of the calibration stimulus, from a signal received from the sensor, wherein the signal is configured to sense a sensed parameter of a battery of the battery system, with the sensed parameter of the battery including an electric parameter of a battery cell of the battery and the battery model corresponding to the battery including a battery cell model corresponding to the battery cell.

7. The system of claim 1, wherein the calibration stimulus includes a first calibration stimulus and a second calibration stimulus, with the first calibration stimulus applied to determine the predicted operational parameter;

the second calibration stimulus applied to determine the actual operational parameter; and the first calibration stimulus includes a predicted stimulus, the second calibration stimulus includes a physical stimulus, with the second calibration stimulus corresponding to the first calibration stimulus.

8. A method for calibrating a battery control system, comprising:

determining, using a design device, a calibration stimulus;

instructing, using the design device, a battery system corresponding with the battery control system to apply the calibration stimulus to a battery pack;

applying, using the design device, the calibration stimulus to a battery model corresponding with the battery pack;

determining, using the design device, a predicted response resulting from supply of the calibration stimulus to the battery model; and adjusting, using the design device, model parameters of the battery model, a control application used to determine the predicted response, or both when a difference between an actual response and the predicted response of the battery pack to calibration stimulus is greater than a difference threshold.

9. The method of claim 8, wherein determining the predicted response comprises:

determining a parameter resulting from supply of the calibration stimulus to the battery model;

determining the predicted response by executing the control application based at least in part on the parameter; and communicating the predicted response to the design device.

10. The method of claim 8, comprising indicating, using the design device, that the battery model, the control application, or both are validated when the difference between the actual response and the predicted response is not greater than the difference threshold via an I/O device.

11. The method of claim 8, wherein determining the calibration stimulus comprises:

identifying a profile of one or more stimulus expected to occur during operation of the battery pack;

determining characteristics of a stimulus from the one or more stimulus; and determining, using the design device, the calibration stimulus from the characteristics of the stimulus.

12. The method of claim 8, wherein adjusting the model parameters of the battery model, the control application used to determine the predicted response, or both comprises:

comparing the difference between the actual response and the predicted response of the battery pack to the calibration stimulus;

determining a graphical representation of the comparison, wherein the graphical representation visualizes performance trade-offs that occur from a design change;

determining the design change based in part on the graphical representation of the calibration stimulus; and adjusting the battery model, the control application, or both, based in part on the design change.

13. The method of claim 8, wherein storing, using the design device, the battery model, the control application, or both in the battery control system to enable subsequent use during operation of the battery system when difference between the actual response and the predicted response is not greater than the difference threshold.

14. A tangible, non-transitory, computer-readable medium storing instructions executable by one or more processors of a design device, wherein the instructions comprise directions to:

determine, using the one or more processors, a calibration stimulus;

instruct, using the one or more processors, a battery system corresponding with a battery control system to apply the calibration stimulus to a battery pack;

apply, using the one or more processors, the calibration stimulus to a battery model corresponding with the battery pack;

determine, using the one or more processors, a predicted response resulting from application of the calibration stimulus to the battery model; and adjust, using the one or more processors, model parameters of the battery model, a control application used to determine the predicted response, or both when a difference between an actual response of the battery pack to calibration stimulus and the predicted response is greater than a difference threshold.

15. The tangible, non-transitory, computer-readable medium of claim 14, wherein the calibration stimulus is derived from one or more characteristics expected to occur during operation of the battery system.

16. The tangible, non-transitory, computer-readable medium of claim 14, wherein the instructions to determine the actual response of the battery pack resulting from application of the calibration stimulus comprise instructions to determine the actual response of the battery pack by executing the control application based at least in part on a sensor data received from one or more sensors.

17. The tangible, non-transitory, computer-readable medium of claim 14, wherein the predicted response or the actual response describes a value representing a charge current limit of the battery pack, stored energy in the battery pack divided by a total energy storage capacity of the battery pack, or a capability of the battery pack to deliver the stored energy.

18. The tangible, non-transitory, computer-readable medium of claim 14, wherein the battery model uses time invariant variables and time variant variables to model the battery pack.

19. The tangible, non-transitory, computer-readable medium of claim 14, comprising instructions to instruct an electronic display to display a graphical representation of the difference between the actual response and the predicted response.

20. The instructions of claim 14, further comprising directions to store, using the one or more processors, the battery model, the control application, or both in the battery control system to enable subsequent use during operation of the battery system when the difference between the actual response and the predicted response is not greater than the difference threshold.

* * * * *